(12) United States Patent
Hsu

(10) Patent No.: US 7,298,154 B2
(45) Date of Patent: Nov. 20, 2007

(54) PROBE APPARATUS

(75) Inventor: Fan-Hsien Hsu, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 6 days.

(21) Appl. No.: 11/308,670

(22) Filed: Apr. 20, 2006

(65) Prior Publication Data

US 2007/0115011 A1    May 24, 2007

(30) Foreign Application Priority Data

Nov. 24, 2005   (TW) .............................. 94141255 A

(51) Int. Cl.
*G01R 31/02*    (2006.01)
*G01R 31/26*    (2006.01)

(52) U.S. Cl. ...................... 324/754; 324/761; 324/765

(58) Field of Classification Search ................. 324/754
See application file for complete search history.

(56) References Cited

U.S. PATENT DOCUMENTS

| | | | | |
|---|---|---|---|---|
| 5,489,852 A | * | 2/1996 | Gomez ...................... | 324/754 |
| 5,546,405 A | * | 8/1996 | Golla ......................... | 714/724 |
| 6,034,533 A | * | 3/2000 | Tervo et al. ................ | 324/762 |
| 6,114,869 A | * | 9/2000 | Williams et al. ............ | 324/765 |

* cited by examiner

*Primary Examiner*—Ha Tran Nguyen
*Assistant Examiner*—Emily Y Chan
(74) *Attorney, Agent, or Firm*—Jianq Chyun IP Office

(57) ABSTRACT

A probe apparatus and a probe system are provided. The probe apparatus uses a larger printed circuit board to dispose a plurality of testers. The layout of each of the testers on the circuit board is modified accordingly, such that more number of the testers can be disposed on the circuit board and the pin count of the probe apparatus is increased. In addition, the probe apparatus can be installed in the test tool. Accordingly, the testing efficiency of the present test tool can be substantially promoted and the cost of the overall testing can be effectively reduced.

7 Claims, 4 Drawing Sheets

PROBE APPARATUS

CROSS-REFERENCE TO RELATED APPLICATION

This application claims the priority benefit of Taiwan application serial no. 94141255, filed on Nov. 24, 2005. All disclosure of the Taiwan application is incorporated herein by reference.

BACKGROUND OF THE INVENTION

1. Field of the Invention

The present invention relates to a wafer testing apparatus, and more particularly, to a probe card where more number of testing probes can be disposed thereon by modifying the layout of the circuit board.

2. Description of Related Art

Along with progressive development of the semiconductor fabricating process, the channel length of the modern semiconductor process is reduced from 0.15 μm to 0.13 μm and further to the newest 90 nanometer. During the semiconductor fabricating process, in order to ensure the yield rate and avoid the package wastage, the electrical properties and the functions of the wafer are required to be tested before the wafer is fabricated, cut and packaged. In such testing method, a testing loop is constituted by a test tool and a probe card, and each probe pin on the probe card directly contacts a pad or a bump on the chip, such that a chip signal is extracted from each chip on the wafer through the probe. Thereafter, the chip signal is sent to the test tool for further analysis. With such testing method, the chips with poor electrical properties or functions are scrapped before the wafer is packaged, such that the problem of the package fabricating cost increasing due to the growing number of the wafers with poor quality is effectively eliminated.

Figure 1A:
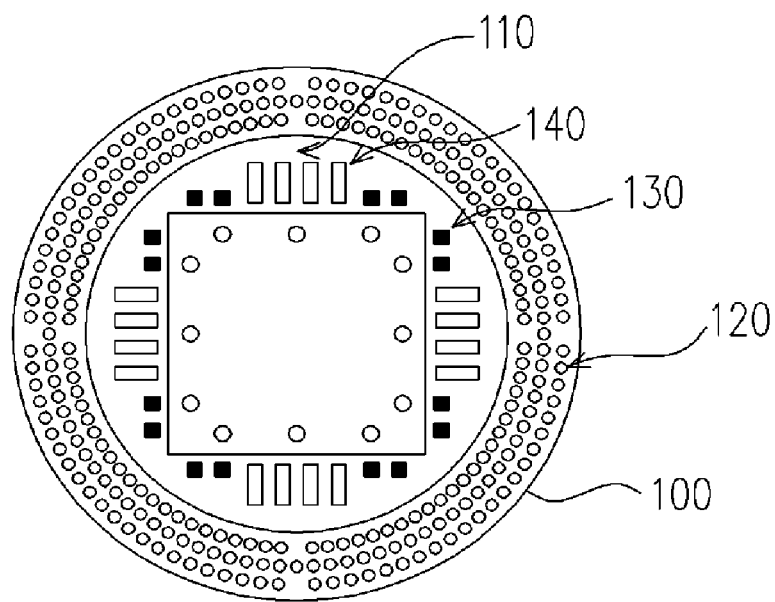
Figure 1B:
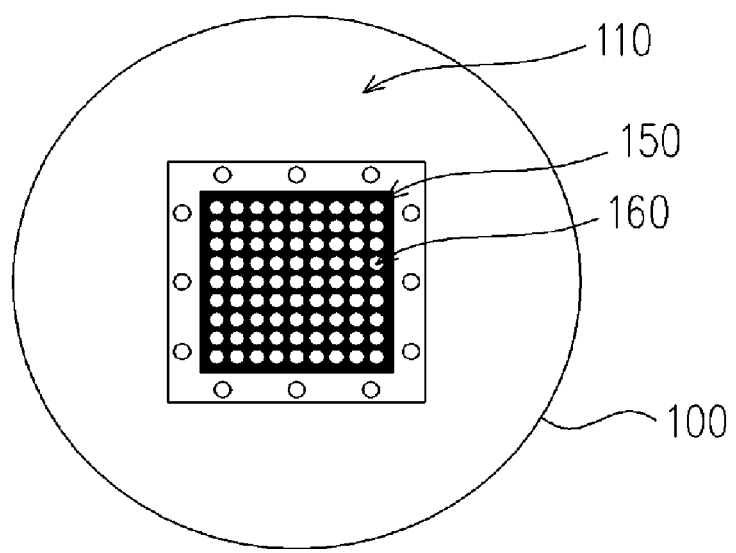

FIG. 1 schematically shows a layout diagram of a conventional probe card. Wherein, the probe card 100 includes a front surface and a back surface that have the specific layout and arrangement as shown in FIGS. 1(a) and 1(b), respectively. Referring to FIG. 1(a), the front surface of the probe card 100 includes multiple pogo pads 120, multiple capacitors 130, and multiple relays 140 that are disposed on the circular printed circuit board (PCB) 110. Wherein, the pogo pads 120 are disposed on the periphery of the PCB 110 with a ring arrangement aligned to the center of the PCB 110. The capacitors 130 and the relays 140 are disposed outside a square area aligned to the center of the PCB 100. Referring to FIG. 1(b), the back surface of the probe card 100 includes a square ceramic head 150 that is disposed on the circular PCB 110. In addition, multiple probe pins 160 are disposed on the ceramic head 150 with an arrangement of a square-shaped array.

The connection and function of the tester are described in detail hereinafter. Wherein, the pogo pads 120 are connected to multiple pogo pins (not shown) on the mother board of the test tool, such that the test signal is transmitted from the mother board to the probe pins through the pogo pads 120, and then the test signal is further transmitted to multiple chips of a test wafer for performing a functional test. In addition, the relays 140 are cooperated with the capacitors 130, such that the capacitors 130 can be controlled and switched by the relays 140 according to the instruction of the test signal to filter the noise in the test signal.

However, since the ICs currently used are demanded to be smaller and capable of providing more functions and higher pin counts, under the pressure of the successful development of the driver share testing method, more number of probe pins are demanded by the test tool. However, the number of the probe pins used in the present probe card is not changed, if the conventional probe card is used to test the wafer, it may require more time and more effort, and the lifespan of the probe card is significantly impacted due to the over-worn of the probe pin. In addition, if it is required to add more number of probe pins on the probe card, since the space on the probe card is limited, the probe card cannot accommodate all of the testers. Moreover, if the size of the probe card is needed to be enlarged, both of the securing unit of the mother board and the probe card of the test tool have to be redesigned and modified accordingly, which significantly raises the test cost.

SUMMARY OF THE INVENTION

Therefore, it is an object of the present invention to provide a probe apparatus, wherein the size of the circuit board in the probe apparatus is enlarged and the layout of each tester on the probe apparatus is changed/modified, so that it is possible to dispose more number of probe pins on the probe apparatus of the present invention, such that the purpose of improving the testing efficiency is achieved.

It is another object of the present invention to provide a probe system, wherein the size of the securing unit of the present test tool is increased in order to install a larger size probe apparatus with more number of probe pins, the efficiency of the probe on the present test tool is improved, such that the overall testing cost can be effectively reduced.

The present invention provides a probe apparatus suitable for testing the semiconductor devices. The probe apparatus includes a circuit board, multiple pogo pads, multiple probe pins, multiple capacitors, and multiple relays. Wherein, the circuit board includes a first surface and a second surface, each having a center. The pogo pads are disposed in a ring arrangement on the first surface of the circuit board with a center thereof coinciding with the center of the first surface. In addition, the probe pins are disposed on the second surface of the circuit board and electrically coupled to the pogo pads. The capacitors are disposed outside the ring arrangement of the pogo pads on the first surface of the circuit board. Moreover, the relays are disposed outside the ring arrangement of the pogo pads on the first surface of the circuit board and electrically coupled to the pogo pads and the capacitors, respectively, wherein the center of the ring of relays coincides with the center of the first surface.

In accordance with a preferred embodiment of the present invention, the probe apparatus further includes a ceramic head disposed on the second surface of the circuit board for disposing the probe pins.

In accordance with the preferred embodiment of the present invention, the relays of the probe apparatus are disposed outside the ring arrangement of the capacitors on the first surface of the circuit board, wherein the center of the ring of relays coincides with the center of the first surface.

In accordance with the preferred embodiment of the present invention, the capacitors of the probe apparatus are outside the ring arrangement of the relays on the first surface of the circuit board, wherein the center of the ring of capacitors coincides with the center of the first surface, and the shape of the circuit board includes a circular shape.

In accordance with the preferred embodiment of the present invention, the pogo pads of the probe apparatus are arranged in a multiple-concentric-ring arrangement.

In accordance with the preferred embodiment of the present invention, the probe pins of the probe apparatus are arranged in a square array arrangement.

The present invention provides a probe system including a test unit, a probe tool, and a probe apparatus. Wherein, the test unit is configured to transmit and receive a test signal that is required for testing a test semiconductor device. The probe tool includes a securing unit and a chuck, wherein the chuck is used for holding the test semiconductor device. In addition, the probe apparatus is installed on the securing unit of the probe tool, such that the test signal can be transmitted from the test unit to the test semiconductor device on the chuck of the probe tool in order to test the electrical properties and functions of the test semiconductor device. The probe apparatus includes a circuit board, multiple pogo pads, multiple probe pins, multiple capacitors, and multiple relays. Wherein, the circuit board includes a first surface and a second surface, each having a center. The pogo pads are disposed in a ring arrangement on the first surface of the circuit board with a center thereof coinciding with the center of the first surface, such that the pogo pads are electrically coupled to the pogo pins on a mother board to transmit the test signal. In addition, the probe pins are disposed on the second surface of the circuit board and electrically coupled to the pogo pads, such that the test signal is transmitted to the semiconductor device for performing the electrical and functional test. The capacitors are disposed outside the ring arrangement of the pogo pads on the first surface of the circuit board for filtering the noise in the test signal, wherein the center of the ring of pogo pads coincides with the center of the first surface. Moreover, the relays are disposed outside the ring arrangement of the pogo pads on the first surface of the circuit board and electrically coupled to the pogo pads and the capacitors respectively, such that the connection between the pogo pads and the capacitors can be selectively switched according to the test signal in order to control the capacitor to filter the noise in the test signal.

In accordance with a preferred embodiment of the present invention, the test unit of the probe system includes a mother board. Wherein, the mother board includes multiple pogo pins, such that the test unit is connected to the pogo pads of the probe apparatus through the pogo pins to transmit and receive the test signal that is required for testing the test semiconductor device.

In accordance with the preferred embodiment of the present invention, the securing unit of the probe system includes a groove for disposing the probe apparatus, and the shape of the groove corresponds to the shape of the probe apparatus.

In the present invention, the layout space of the circuit board in the probe apparatus is increased, and the layout of each tester in the probe apparatus is modified accordingly, thus a larger number of probe pins may be included within the probe apparatus and the probe apparatus can be installed on the old type test tool. Accordingly, the testing efficiency of the test tool can be substantially promoted and the overall cost of the test tool can be effectively reduced.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

FIGS. 1(a) and 1(b) schematically show the layout diagrams of the first and second surfaces of a conventional probe card, respectively.

Figure 2A:
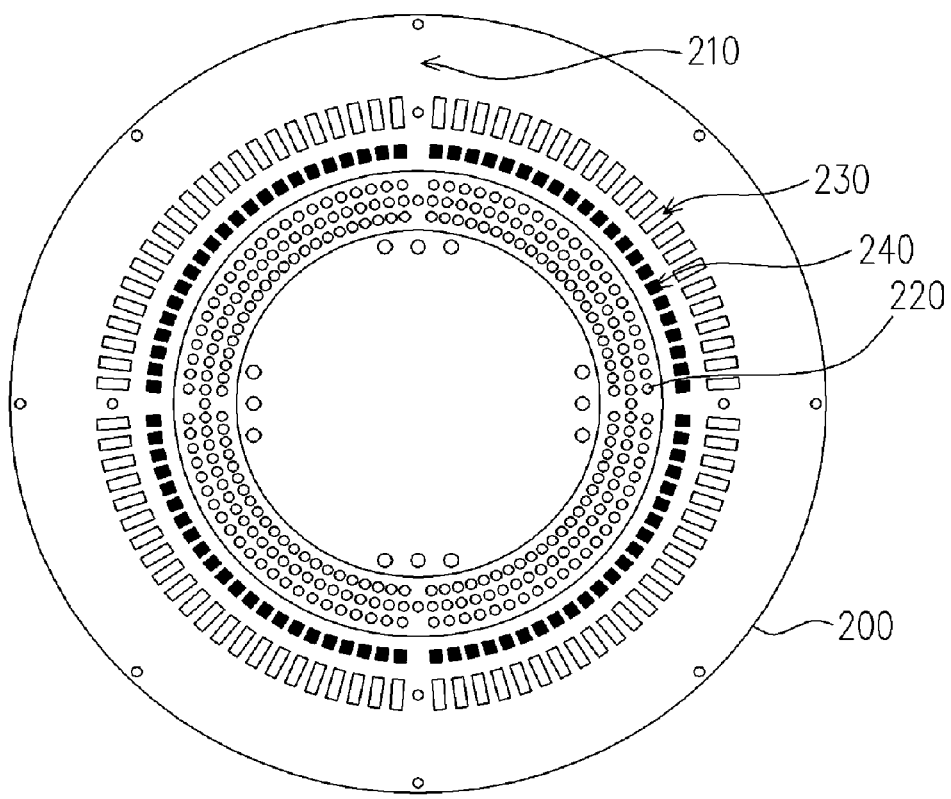
Figure 2B:
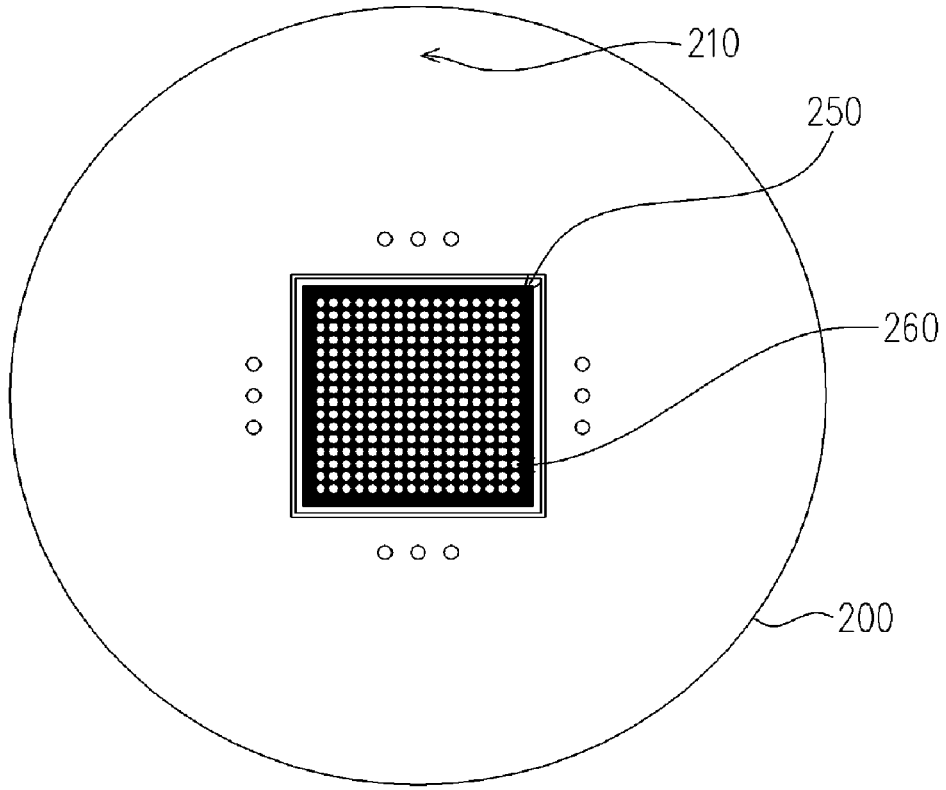

FIGS. 2(a) and 2(b) schematically show the layout diagrams of the first and second surfaces of a probe card according to a preferred embodiment of the present invention, respectively.

FIG. 2(c) schematically shows the layout diagrams of the first and second surfaces of a probe card according to another embodiment of the present invention, respectively.

Figure 3:
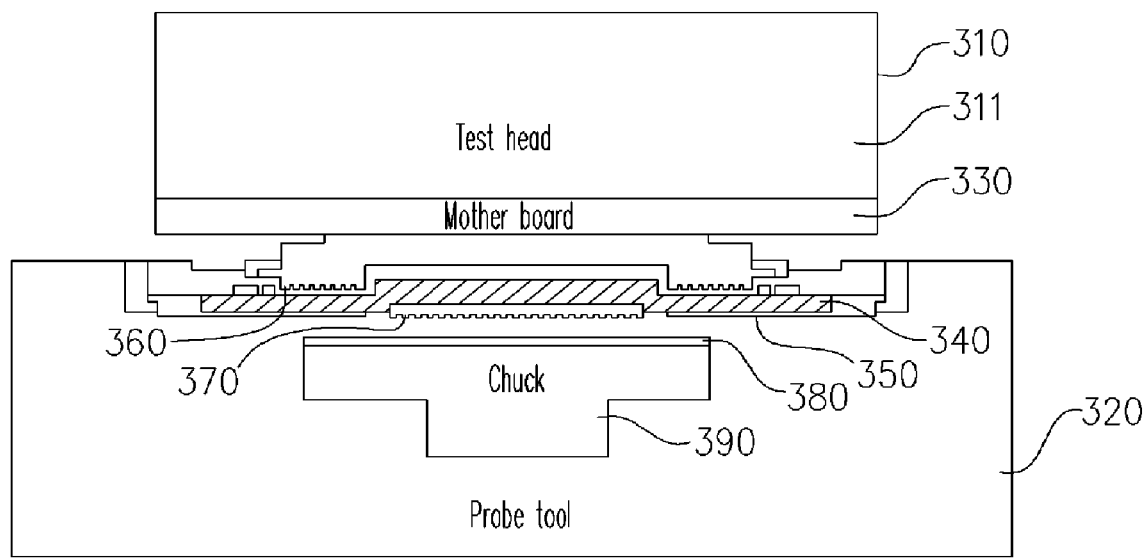

FIG. 3 schematically shows a configuration diagram of a probe system 300 according to the preferred embodiment of the present invention.

DESCRIPTION OF PREFERRED EMBODIMENTS

Figure 2:
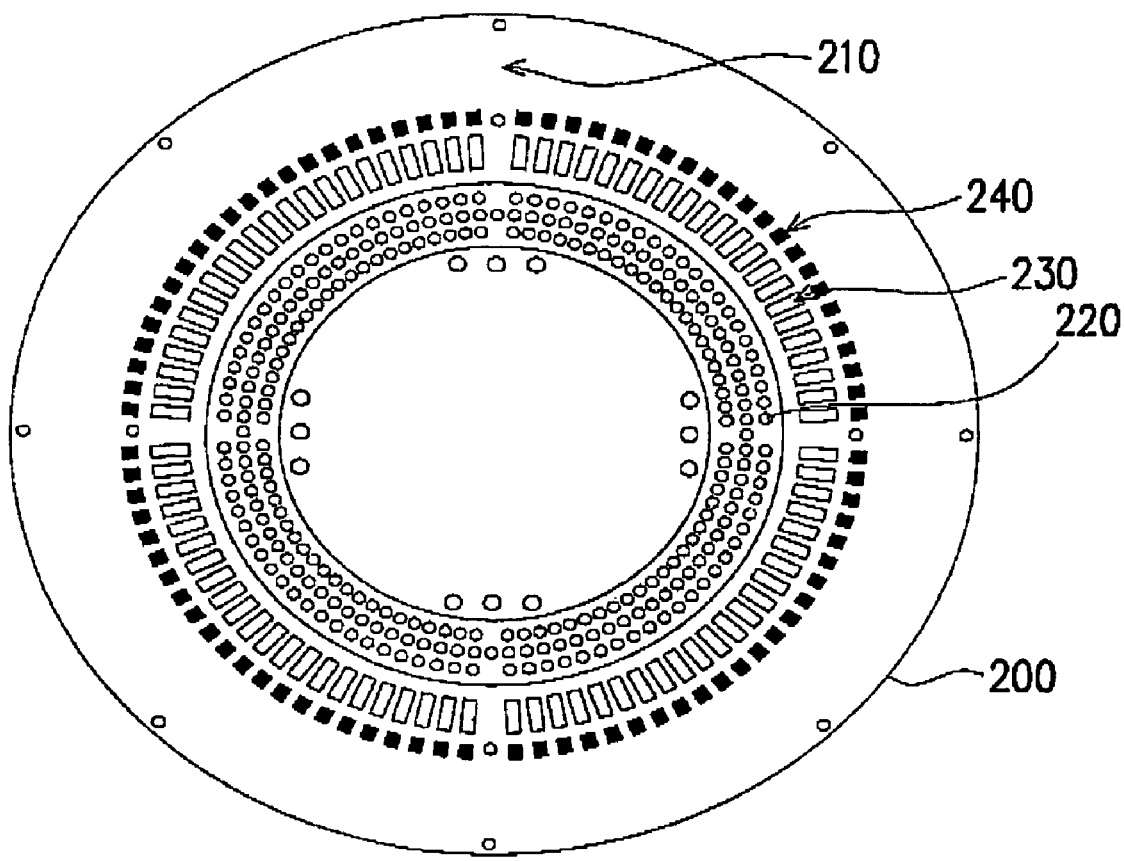

FIG. 2 schematically shows the layout diagrams of a probe apparatus according to a preferred embodiment of the present invention. Referring to FIG. 2, in the present embodiment, the space on the circuit board is increased and the layout of each tester in the circuit board is modified accordingly, such that a larger number of probe pins may be disposed on the probe card and the testing effectiveness is effectively increased without modifying mother board.

As shown in FIG. 2, compared to the circuit board 110 in the conventional probe card (referring to FIG. 1), the size of the circuit board 210 in the probe apparatus 200 of the present embodiment is increased, and the circuit board 210 includes a first surface and a second surface. Wherein, FIG. 2(a) is a layout diagram of the first surface, and FIG. 2(b) is a layout diagram of the second surface. As shown in FIG. 2(a), multiple pogo pads 220 are arranged in a multiple-concentric-ring arrangement with a center thereof coinciding with the center of the circuit board 210. Wherein, the positions of the pogo pads 220 should correspond to the positions of the pogo pins in the mother board of the test tool (not shown). Accordingly, the mother board need not be modified and can be used to perform the test process.

A single circle of multiple relays 230 is further disposed outside the ring arrangement of the pogo pads 220, wherein the center of the circle of the multiple relays coincides with the center of the circuit board 210. Compared to the layout of the conventional probe card 100, the probe apparatus 200 of the present embodiment can accommodate more number of relays 230. However, the arrangement of the relays 230 mentioned above is only an embodiment of the present invention, the relays 230 may also be disposed in a multiple-concentric-ring arrangement according to the requirement of the user as shown in the FIG. 2(c).

In addition, multiple capacitors 240 is further disposed between the pogo pads 220 and the relays 230. Wherein, the capacitors 240 are arranged in a single-ring arrangement on the circuit board 210 relative to the position of each relay 230. However, the shape and number of rings of the arrangement are not limited to it. Please also refer to FIG. 2(c) which schematically shows the layout diagrams of the first and second surfaces of a probe card according to another embodiment of the present invention, respectively. The capacitors 240 are disposed outside the ring arrangement of the relays 230.

A square ceramic head 250 is disposed on the second surface of the circuit board 210 as shown in FIG. 2(b). Wherein, the ceramic head 250 includes multiple probe pins 260 which are arranged in a square array on the ceramic head 250. However, the probe pins 260 also can be disposed with different arrangements according to the requirement of the user.

During the testing process, each of the probe pins 260 is directly contacted with a pad or a bump on a chip (not shown). Thereafter, a test signal is transmitted to the chip through the probe pin 260 of the probe apparatus 200 with the control of the software in the test tool to perform the functional test on the chip. Meanwhile, a chip signal is extracted and then sent back to the test tool for further analysis. Finally, the test tool determines whether the electrical properties and functions of each chip on the semiconductor device are optimum or not.

Compared with the conventional probe pins 160 (as shown in FIG. 1(b)) and the probe pins 260 (as shown in FIG. 2(b)) of the present embodiment, the total number of the probe pins 260 in the present embodiment is substantially enlarged. Accordingly, more number of chips can be tested in a comparatively shorter testing time, and thus the testing efficiency is substantially promoted.

FIG. 3 schematically shows a configuration diagram of a probe system 300 according to the preferred embodiment of the present invention. Referring to FIG. 3, in the present embodiment, the probe apparatus of the present invention is applied in the present test tool to configure a new probe system 300. According to the present embodiment, comparatively more number of the chips can be tested at one time, such that the testing efficiency of the test tool can be effectively promoted and the overall testing cost can be effectively reduced.

As shown in FIG. 3, the probe system 300 of the present embodiment mainly includes a test unit 310 and a probe tool 320. Wherein, the test unit 310 includes a test head 311 and a mother board 330. The probe apparatus 340 is secured on the probe tool 320 with the securing unit 350. In addition, the pogo pads (not shown) of the probe apparatus 340 are directly contacted with the pogo pins 360 that are disposed below the mother board 330 to receive the test signal for testing the chip from the test unit 310. Moreover, the test signal is transmitted to multiple chips on the test wafer 380 through multiple probe pins 370 on the probe apparatus 340, so as to determine whether the electrical properties and functions of the chips are optimum or not.

The probe tool 320 includes a chuck 390 for loading and spinning the test wafer 380, such that the probe apparatus 340 can test multiple chips on different areas of the test wafer 380.

In the probe system 300 of the present embodiment, the size of the securing unit 350 is modified accordingly to adapt with the enlarged space of the probe apparatus 340, and the pogo pads of the probe apparatus 340 are disposed with the same arrangement of the present test tool. Accordingly, the total number of the chips that can be tested at one time by the probe apparatus 340 is increased, and the testing efficiency of the present test tool is substantially promoted without modifying the design of the mother board 330.

For example, only 32 DUTs (device under test) can be tested by the conventional probe apparatus at one time. However, by using the probe apparatus of the present invention in conjunction with the driver share testing technique, more than 64 or 128 DUTs can be tested at one time. In other words, the testing time can be reduced by ½ or ¼ compared to the conventional probe apparatus.

In summary, in the probe apparatus of the present invention, a larger circuit board is used for disposing the testers and the layout of each tester in the circuit board is modified accordingly, such that more number of testers can be disposed on the circuit board and the pin count of the probe apparatus is increased. In addition, the probe apparatus may be installed in the test tool. Accordingly, the testing efficiency of the present test tool is substantially promoted and the overall cost of testing can be substantially reduced.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A probe apparatus suitable for testing a semiconductor device, comprising:
   a circuit board comprising a first surface and a second surface, each having a center respectively;
   a plurality of pogo pads disposed on the first surface in at least one ring arrangement with a center coinciding with the center of the first surface;
   a plurality of probe pins disposed on the second surface of the circuit board and electrically coupled to the pogo pads accordingly;
   a plurality of capacitors disposed outside the ring arrangement of the pogo pads on the first surface of the circuit board in a ring arrangement, wherein a center of the ring of the capacitors coincides to the center of the first surface, and a distance from the center to any capacitor is larger than a distance from the center to any pogo pad; and
   a plurality of relays disposed outside the pogo pads on the first surface of the circuit board in a ring arrangement and electrically coupled to the pogo pads and the capacitors, respectively, wherein a center of the ring of relays coincides with the center of the first surface, and a distance from the center to any relay is larger than a distance form the center to any pogo pad.

2. The probe apparatus of claim 1, further comprising:
   a ceramic head disposed on the second surface of the circuit board for disposing the probe pins.

3. The probe apparatus of claim 1, wherein the relays are disposed outside the ring arrangement of the capacitors on the first surface of the circuit board, wherein a center of the ring of the relays coincides with the center of the first surface.

4. The probe apparatus of claim 1, wherein the capacitors are disposed outside the ring arrangement of the relays on the first surface of the circuit board, wherein a center of the ring of the capacitors coincides with the center of the first surface.

5. The probe apparatus of claim 1, wherein the shape of the circuit board comprises a circular shape.

6. The probe apparatus of claim 1, wherein the pogo pads are arranged in a multiple-concentric-ring arrangement.

7. The probe apparatus of claim 1, wherein the probe pins are arranged in a square array.

* * * * *